(12) United States Patent
Okubo et al.

(10) Patent No.: US 11,444,061 B2
(45) Date of Patent: Sep. 13, 2022

(54) SEMICONDUCTOR MEMORY DEVICE AND METHOD FOR DRIVING THE SAME

(71) Applicant: Kioxia Corporation, Tokyo (JP)

(72) Inventors: Takuro Okubo, Yokkaichi (JP); Hidekazu Hayashi, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 2 days.

(21) Appl. No.: 17/161,907

(22) Filed: Jan. 29, 2021

(65) Prior Publication Data

US 2022/0028833 A1    Jan. 27, 2022

(30) Foreign Application Priority Data

Jul. 22, 2020   (JP) .............................. JP2020-125438

(51) Int. Cl.
| | |
|---|---|
| *H01L 25/065* | (2006.01) |
| *H01L 21/768* | (2006.01) |
| *H01L 23/00* | (2006.01) |
| *H01L 25/00* | (2006.01) |
| *H01L 23/48* | (2006.01) |
| *H01L 25/18* | (2006.01) |

(52) U.S. Cl.
CPC .... *H01L 25/0657* (2013.01); *H01L 21/76898* (2013.01); *H01L 23/481* (2013.01); *H01L 24/08* (2013.01); *H01L 24/80* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2924/1431* (2013.01); *H01L 2924/14511* (2013.01)

(58) Field of Classification Search
CPC ........... H01L 25/0657; H01L 21/76898; H01L 23/481; H01L 24/08; H01L 24/80; H01L 25/18; H01L 25/50; H01L 2224/08145; H01L 2224/80895; H01L 2224/80896; H01L 2225/06541; H01L 2924/1431; H01L 2924/14511

See application file for complete search history.

(56) References Cited

U.S. PATENT DOCUMENTS

| | | | |
|---|---|---|---|
| 2004/0245541 A1* | 12/2004 | Shitagaki | ............ H01L 51/5206 313/504 |
| 2012/0299202 A1 | 11/2012 | Yamaguchi et al. | |
| 2014/0242779 A1 | 8/2014 | Nakamura et al. | |

(Continued)

FOREIGN PATENT DOCUMENTS

| | | |
|---|---|---|
| JP | 5784658 B2 | 9/2015 |
| JP | 6212720 B2 | 10/2017 |

*Primary Examiner* — Thanh Y. Tran
(74) *Attorney, Agent, or Firm* — Oblon, McClelland, Maier & Neustadt, L.L.P.

(57) ABSTRACT

A manufacturing method of a semiconductor device according to an embodiment comprises, bonding a first semiconductor substrate and a second semiconductor substrate to form a stack, filling a first fill material having a first viscosity in a gap located between an outer peripheral portion of the first semiconductor substrate and an outer peripheral portion of the second semiconductor substrate, filling a second fill material having a second viscosity higher than the first viscosity in the gap so as to be adjacent to the first fill material after filling the first fill material in the gap and thinning the second semiconductor.

21 Claims, 14 Drawing Sheets

(56) References Cited

U.S. PATENT DOCUMENTS

2015/0179975 A1* 6/2015 Nagata ................ H01L 51/5246
  257/40
2016/0190103 A1 6/2016 Kabe et al.
2020/0381397 A1* 12/2020 Yu ........................... H01L 21/78

* cited by examiner

SEMICONDUCTOR MEMORY DEVICE AND METHOD FOR DRIVING THE SAME

CROSS-REFERENCE TO RELATED APPLICATION(S)

This application is based upon and claims the benefit of priority from the prior Japanese Patent Application No. 2020-125438, filed on Jul. 22, 2020, the entire contents of which are incorporated herein by reference.

FIELD

Embodiment described herein relate generally to a semiconductor memory device and a method for driving the same.

BACKGROUND

As a semiconductor device manufacturing method, for example, a bonding process is known in which a first semiconductor substrate having a peripheral circuit including a CMOS and a second semiconductor substrate having a memory cell array are respectively formed, and then the first semiconductor substrate and the second semiconductor substrate are bonded together. In the bonding process, a metal pad provided in the first semiconductor substrate and a metal pad provided in the second semiconductor substrate are bonded.

DETAILED DESCRIPTION

Figure 1:
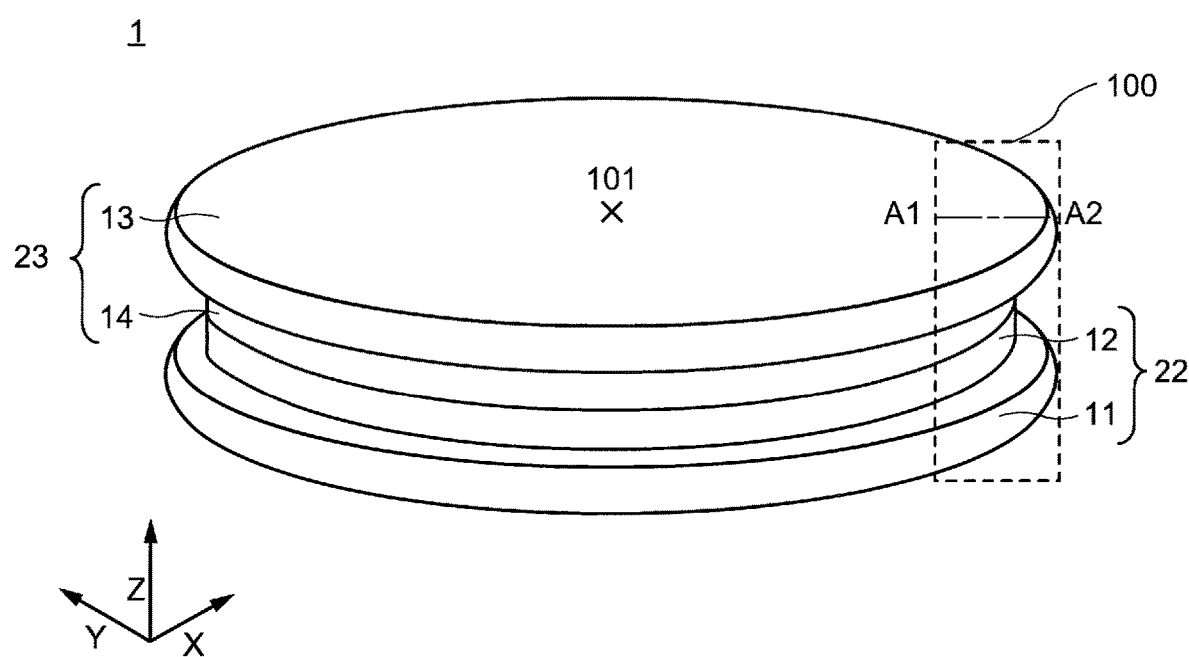
FIG. 1 is a perspective view showing a semiconductor device according to an embodiment.

A manufacturing method of a semiconductor device according to an embodiment comprises, bonding a first semiconductor substrate and a second semiconductor substrate to form a stack, filling a first fill material having a first viscosity in a gap located between an outer peripheral portion of the first semiconductor substrate and an outer peripheral portion of the second semiconductor substrate, filling a second fill material having a second viscosity higher than the first viscosity in the gap so as to be adjacent to the first fill material after filling the first fill material in the gap and thinning the second semiconductor.

A semiconductor device according to an embodiment comprises, a first semiconductor substrate, a second semiconductor substrate constituting a stack by bonding with the first semiconductor substrate and thinner than the first semiconductor substrate, a gap provided between an outer peripheral portion of the first semiconductor substrate and an outer peripheral portion of the second semiconductor substrate, a first fill material provided in the gap and having a first viscosity, and a second fill material provided in the gap adjacent to the first fill material having a second viscosity higher than the first viscosity.

The semiconductor device and the manufacturing method of the semiconductor device according to the embodiment will be described in detail below with reference to the drawings. In the following description, components having substantially the same functions and configurations are denoted by the same reference numerals, and redundant descriptions will be made only when necessary. The following embodiments described below exemplifies a device and a method for embodying the technical idea of this embodiment, and does not specify the materials, shapes, structures, arrangements, and the like of the components as follows. The technical idea of the embodiment includes various modifications to those described in the claims.

<Overall Configuration of Semiconductor Device 1>

Figure 2:
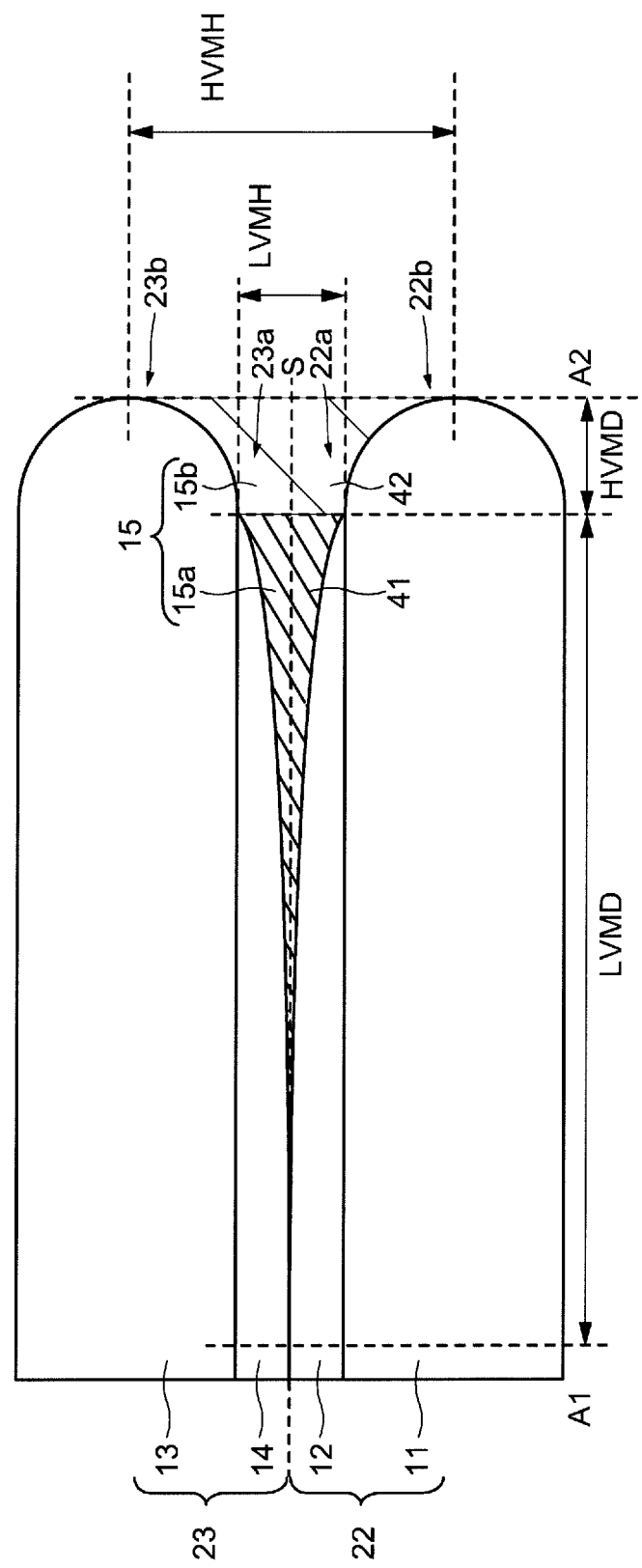
FIG. 2 is a cross-sectional view showing a semiconductor device according to an embodiment.
Figure 3:
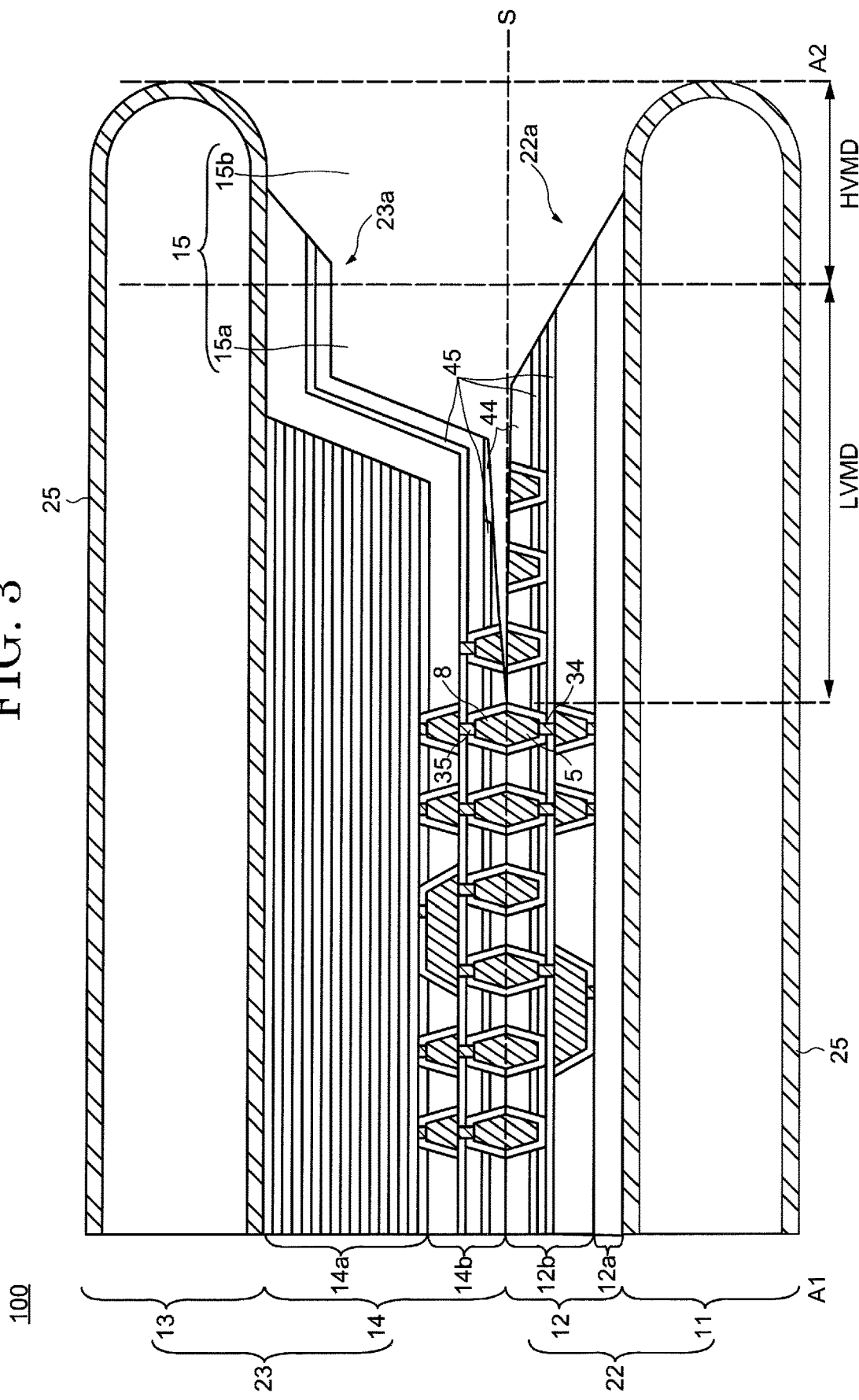
FIG. 3 is a cross-sectional view showing a semiconductor device according to an embodiment.

FIG. 1 is a perspective view showing a semiconductor device 1 according to the present embodiment. FIG. 2 is a cross-sectional view along A1-A2 of a region 100 included in the semiconductor device 1 shown in FIG. 1. FIG. 3 is a more detailed cross-sectional view along A1-A2 of the region 100 included in the semiconductor device 1 shown in FIG. 1. The configuration of the semiconductor device 1 according to the present embodiment is not limited to the configurations shown in FIGS. 1 to 3.

As shown in FIG. 1, the semiconductor device 1 has a first semiconductor substrate 22, and a second semiconductor substrate 23. The first semiconductor substrate 22 has a substrate 11 and a first circuit unit 12 provided on the substrate 11. The second semiconductor substrate 23 has a substrate 13 and a second circuit unit 14 provided on the substrate 13. Although described in detail later, the first circuit unit 12 and the second circuit unit 14 are device layers having devices such as a plurality of transistors and passive elements. As will be described in detail later, the first circuit unit 12 has a first metal pad 5 (FIG. 3) and the second circuit unit 14 has a second metal pad 8 (FIG. 3). By connecting the first metal pad 5 (FIG. 3) and the second metal pad 8 (FIG. 3), the first semiconductor substrate 22 is bonded to the second semiconductor substrate 23. In FIG. 1, illustrations of a first fill material 41 (FIG. 2) and a second fill material 42 (FIG. 2) are omitted. The substrate 11, and the substrate 13 are, for example, silicon substrates (silicon wafers).

In the process of manufacturing the first semiconductor substrate 22 and the second semiconductor substrate 23, each substrate is processed by multiple times of chemical mechanical polishing (CMP). Consequently, in the first semiconductor substrate 22, and the second semiconductor substrate 23, an end of the first circuit unit 12 and an end of the second circuit unit 14 have an excessively polished shape, so-called, a roll-off (terminal over polishing) shape. In FIG. 1, in order to simply show the configuration of the semiconductor device 1, thickness of the first circuit unit 12 and the second circuit unit 14 are uniform. Actually, as shown in FIG. 2 and later, the thickness of the first circuit unit 12 is thinner toward from the center of the first semiconductor substrate 22 and the center of the second semiconductor substrate 23 to an end 22b of the first semiconductor substrate 22. Similar to the thickness of the first circuit unit 12, the thickness of the second circuit unit 14 is thinner toward from the center of the second semiconductor substrate 23 to an end 23b of the second semiconductor substrate 23.

As shown in FIG. 2, the semiconductor device 1 has a gap 15 provided between the first semiconductor substrate 22 and the second semiconductor substrate 23. Descriptions of the same or similar components as those in FIG. 1 may be omitted. In a cross-sectional view of the semiconductor device 1, the gap is provided along a surface 22a of the first semiconductor substrate 22, and a surface 23a of the second semiconductor substrate 23. The gap includes a first gap portion 15a and a second gap portion 15b. The first gap portion 15a is located closer to the center 101 of the first semiconductor substrate 22 and the second semiconductor substrate 23 than the end 22b of the first semiconductor substrate 22 and the end 23b of the second semiconductor substrate 23. The second gap portion 15b is provided between the first gap portion 15a and the end 22b of the first gap portion 15a and the first semiconductor substrate 22 and the end 23b of the second semiconductor substrate 23. The semiconductor device 1 includes the first fill material 41 and the second fill material 42.

Reference numeral S shows a bonding surface of the first semiconductor substrate 22 and the second semiconductor substrate 23. The bonding surface S is a surface shown for convenience. The semiconductor device 1 has a stack obtained by bonding the first semiconductor substrate 22 and the second semiconductor substrate 23. The first semiconductor substrate 22 and the second semiconductor substrate 23 are integrated. For example, the bonding surface S can be determined by analyzing the cross section of the semiconductor device 1.

In the semiconductor device 1 according to the present embodiment, for example, the surface 22a of the first semiconductor substrate 22 may be referred to as an outer peripheral portion of the first semiconductor substrate 22, the surface 23a of the second semiconductor substrate 23 may be referred to as an outer peripheral portion of the second semiconductor substrate 23, the gap 15 may be referred to as a gap portion or an unbonded portion, the first gap portion 15a may be referred to as a thin layer portion or the innermost thin layer portion of the gap 15, the second gap portion 15b may be referred to as a thick layer portion or the outermost thick layer portion of the gap 15.

For example, the thickness LVMH (in the cross-sectional view) of the first gap portion 15a is 50 μm or less, and the length (width in the cross-sectional view) LVMD of the first gap portion 15a in the depth direction is 350 μm or more and 3500 μm or less. For example, the thickness HVMH (in the cross-sectional view) of the second gap portion 15b is thicker than 50 μm and 700 μm or less, and the length (width in the cross-sectional view) HVMD of the second gap portion 15b in the depth direction is shorter than 350 μm. The thickness HVMH of the second gap portion 15b is thicker than the thickness LVMH of the first gap portion 15a.

The first fill material 41 is provided in the gap 15, in particular, in the first gap portion 15a. The first gap portion 15a in which the first fill material 41 is provided is a thin layer. In the case where the material constituting the first fill material 41 is a material having a large viscosity (high viscosity), there is a possibility that the material constituting the first fill material 41 cannot fill the first gap portion 15a. Consequently, after bonding the first semiconductor substrate 22 and the second semiconductor substrate 23 to form a stack, when thinning at least one of the first semiconductor substrate 22 and the second semiconductor substrate 23, chipping and peeling may occur. Therefore, it is preferable that the material constituting the first fill material 41 is a material having a small viscosity (low viscosity) so as to penetrate into the first gap portion 15a in detail. The material constituting the first fill material 41 includes an organic compound. The material constituting the first fill material 41 includes, for example, a silicon compound and an organic solvent. Further, a viscosity μ1 of the material of the first fill material 41 is 0.1 mPa·s (millipascal seconds) or more and less than 1000 mPa·s, and is, for example, 2.2 mPa·s.

The second fill material 42 is provided in the gap 15, in particular, in the second gap portion 15b. The second fill material 42 is provided adjacent to the first fill material 41. The second gap portion 15b in which the second fill material 42 is provided is a thick layer. When the material constituting the second fill material 42 is a small viscosity (low viscosity) material, there is a possibility that the material constituting the second fill material 42 cannot fill the second gap portion 15b. Consequently, after bonding the first semiconductor substrate 22 and the second semiconductor substrate to form a stack, when thinning at least one of the first semiconductor substrate 22 and the second semiconductor substrate 23, chipping and peeling may occur. Therefore, it is preferable that the material constituting the second fill material 42 is a highly viscous material that is in close contact with the first fill material 41, the surface 22a of the first semiconductor substrate 22, and the surface 23a of the second semiconductor substrate 23 and can fill the second gap portion 15b. The material constituting the second fill material 42 includes a glass material or an inorganic polymer. The material constituting the second fill material 42 includes, for example, an oxide containing aluminum. The viscosity μ2 of the material of the second fill material 42 is 1000 mPa·s (millipascal seconds) or more and less than 1000000 mPa·s, and is, for example, 50 mPa·s. The viscosity of the material constituting the second fill material 42 is higher than the viscosity of the material constituting the first fill material 41.

As shown in FIG. 3, the first semiconductor substrate 22 has an insulating film 25. The insulating film 25 is provided so as to cover the substrate 11. Descriptions of the same or similar components as those in FIGS. 1 and 2 may be omitted. The first circuit unit 12 includes, for example, a plurality of transistors including a CMOS, a passive element, a peripheral circuit unit 12a having a wiring layer connected to at least a part of the first metal pad 5, and a plurality of electrode layers 12b. The plurality of electrode layers 12b includes, for example, a plurality of wiring layers (not shown), a plurality of first metal pads 5, a plurality of via plugs 34, an insulating film 44, and an insulating film 45. The peripheral circuit 12a is electrically connected to the plurality of via plugs 34 and a plurality of first metallic pads 5 provided on the via plug 34 in the insulating film 44 and the insulating film 45. For the first semiconductor substrate 22, a through electrode (not shown) penetrating the first semiconductor substrate 22 may be formed in advance. In FIG. 3, illustrations of the first fill material 41 (FIG. 2) and the second fill material 42 (FIG. 2) are omitted.

The second semiconductor substrate 23 has the insulating film 25 so as to cover the substrate 13. The second circuit unit 14 includes, for example, a memory cell unit 14a having the plurality of transistors including the CMOS, the passive element, a memory cell array including a plurality of memory cells, a plurality of source lines, a plurality of word lines, a plurality of bit lines, and a wiring layer connected to at least a part of the second metal pad 8, and a plurality of electrode layers 14b. The plurality of electrode layers 14b includes, for example, the plurality of wiring layers (not shown), a plurality of second metal pads 8, a plurality of via plugs 35, the insulating film 44, and the insulating film 45. The memory cell unit 14a is electrically connected to the plurality of via plugs 35 and the plurality of second metallic pads 8 provided on the via plugs 35 in the insulating film 44 and the insulating film 45. For the second semiconductor substrate 23, a through electrode (not shown) penetrating the second semiconductor substrate 23 may be formed in advance.

The insulating film 25, the insulating film 44, and the first metal pad 5 are exposed on the surface 22a of the first semiconductor substrate 22. The insulating film 25, the insulating film 44, and the second metal pad 8 are exposed on the surface 23a of the second semiconductor substrate 23. The material constituting the insulating film 25 include, for example, silicon oxide. Materials constituting the insulating film 44 is, for example, a material containing oxide and silicon, which is different from the material constituting the insulating film 25. Materials constituting the insulating film 45 include, for example, inorganic insulating materials such as silicon nitride, silicon carbide, silicon oxynitride, and nitrogen-containing silicon carbide. The materials constituting the first metal pad 5 and the second metal pad 8 may include, for example, a copper or a copper alloy, or may include other conductive materials such as metals.

After bonding the first semiconductor substrate 22 and the second semiconductor substrate 23, the second semiconductor substrate 23 is thinned. The second semiconductor substrate 23 is thinned using, for example, back grinding or chemical solution. At this time, the second semiconductor substrate 23 is thinned to the extent that the second circuit unit 14 remains. The substrate 13 of the second semiconductor substrate 23 may or may not remain.

In the first semiconductor substrate 22 and the second semiconductor substrate 23, since an end of the first circuit unit 12 and an end of the second circuit unit 14 are roll-off shaped, when bonding the first semiconductor substrate 22 and the second semiconductor substrate 23, the gap 15 occurs. If the second semiconductor substrate 23 is thinned while the gap 15 is occurred, there is a possibility that a chipping or peeling occurs in the stack. Consequently, there is a possibility that the quality of the semiconductor device 1 and a manufacturing yield are lowered. For example, in order to suppress the deterioration of the semiconductor device 1 and the manufacturing yield, the gap 15 may be filled with one type of filler material. However, in this method, both the first gap portion 15a (thin layer portion) and the second gap portion 15b (thick layer portion) of the gap 15 may not be sufficiently filled.

In the semiconductor device 1 of the present embodiment, the first gap portion 15a (thin layer portion) is filled with the first fill material 41, and the second gap portion 15b (thick layer portion) is filled with the second fill material 42 having a higher viscosity than the viscosity of the first fill material 41. As a result, in the semiconductor device 1 of the present embodiment, the gap 15 can be sufficiently filled. Therefore, the semiconductor device 1 of the present embodiment has a configuration effective for suppressing chipping and peeling. Further, the semiconductor device 1 of the present embodiment has a valid configuration in order to suppress the deterioration of the semiconductor device 1 and the manufacturing yield.

<Manufacturing Process of Semiconductor Device 1>

FIG. 4A, FIG. 4B, FIG. 4C, and FIG. 4D are cross-sectional views showing the manufacturing process of the semiconductor device 1 according to the present embodiment. The manufacturing process of the semiconductor device 1 according to the present embodiment is not limited to the configurations shown in FIG. 4A, FIG. 4B, FIGS. 4C, and 4D. Descriptions of the same or similar components as those of FIGS. 1 to 3 may be omitted.

Figure 4A:
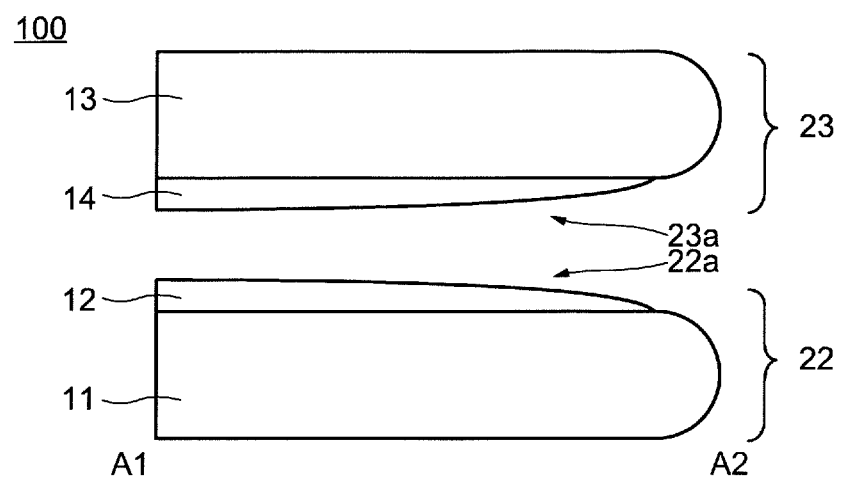
FIG. 4A is a cross-sectional view showing a manufacturing process of a semiconductor device according to an embodiment.

As shown in FIG. 4A, the first semiconductor substrate 22 and the second semiconductor substrate 23 are prepared. Bonding the first semiconductor substrate 22 and the second semiconductor substrate 23, the stack is forming. At this time, as shown in FIG. 3, a surface of a part of the insulating film 44 exposed on the surface 22a of the first semiconductor substrate 22, and a surface of a part of the insulating film 44 exposed on the surface 23a of the second semiconductor substrate 23 are directly bonded by the element diffusion between the insulators, van der Waals force, and chemical reaction such as dehydration condensation and polymerization or the like, and the surface of the first metal pad 5, and the surface of the second metal pad 8 are directly bonded by the element diffusion between the metals, van der Waals force, and recrystallization or the like due to volume expansion or melting. For the bonding process, techniques known in the art can be used. For example, the first semiconductor substrate 22 and the second semiconductor substrate 23 may be bonded using mechanical pressure, may be bonded using annealing, or may be bonded using both mechanical pressure and annealing. Some of the first metal pads 5 or some of the second metal pads 8 may be dummy electrodes that are not connected to each other.

Figure 4B:
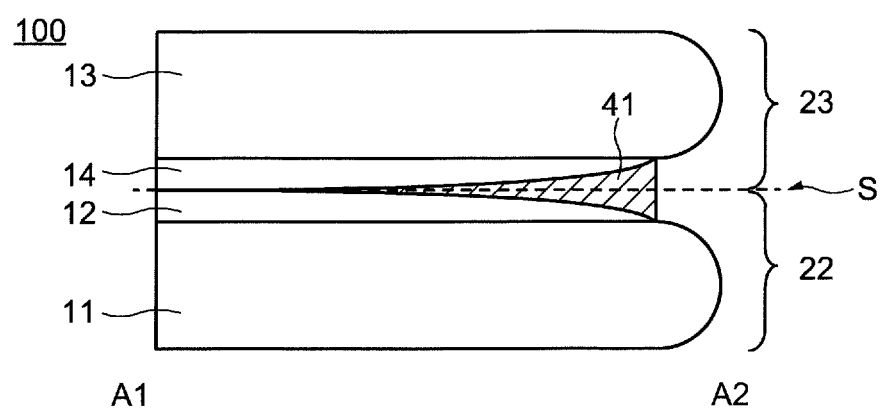
FIG. 4B is a cross-sectional view showing a manufacturing process of a semiconductor device according to an embodiment.

Next, as shown in FIG. 4B, the fill material is filled in the gap 15. Specifically, the first gap portion 15a is filled with the first fill material 41. As a method of filling the first gap portion 15a with the first fill material 41, for example, there is a method of using a fill material supply device such as a dispense nozzle or a dropper, the details of which will be described later.

Figure 4C:
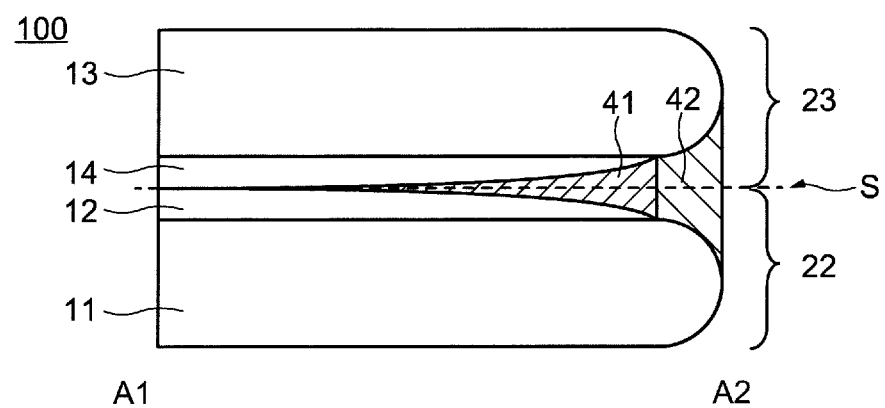
FIG. 4C is a cross-sectional view showing a manufacturing process of a semiconductor device according to an embodiment.

Next, as shown in FIG. 4C, the fill material is filled in the gap 15. Specifically, the second gap portion 15b is filled with the second fill material 42 having a higher viscosity than the first fill material 41. As a method of filling the second gap portion 15b with the second fill material 42, for example, there is a method of rubbing a film in which the second fill material 42 is adhered in a thin film shape along the outer periphery of the stack.

Figure 4D:
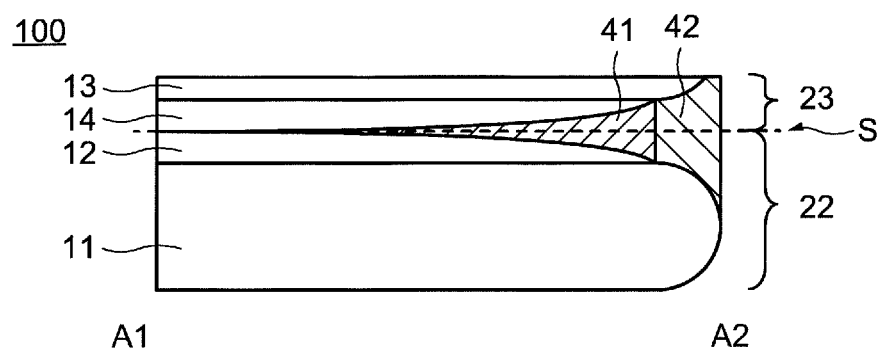
FIG. 4D is a cross-sectional view showing a manufacturing process of a semiconductor device according to an embodiment.

Next, as shown in FIG. 4D, the second semiconductor substrate 23 is thinned. Specifically, the surface of the second semiconductor substrate 23 opposite to the surface 23a (back surface, the surface opposite to the surface on which the second metallic pads 8 (FIG. 3) are formed) is subjected to be thinned using back grind or chemical solution. Thus, the second semiconductor substrate 23 can be thinned to a desired thickness.

As described above, in the semiconductor device 1 of the present embodiment, the first semiconductor substrate 22 and the second semiconductor substrate 23 are manufactured, respectively, and applying the bonding process for bonding the first semiconductor substrate 22 and the second semiconductor substrate 23. Consequently, the semiconductor device 1 of the embodiment, since it is possible to separate the thermal process of the manufacturing process, it has a valid configuration for suppressing the effect of the temperature of the manufacturing process. Further, in the semiconductor device 1 of the present embodiment, the first semiconductor substrate 22 having a peripheral circuit and the second semiconductor substrate 23 having the memory cell array are manufactured, respectively, and applying the bonding process for boding the first semiconductor substrate 22 and the second semiconductor substrate 23. Consequently, the semiconductor device 1 of the embodiment has a configuration that can effectively utilize the area of the semiconductor device 1 and has a configuration that can reduce the size of the semiconductor device. Further, in the semiconductor device 1 of the present embodiment, the gap 15 is filled with two kinds of fill materials, i.e., the first fill material 41 and the second fill material 42 having higher viscosity than the first fill material 41. Consequently, in the semiconductor device 1 of the present embodiment, since it is possible to sufficiently filled the gap 15, to suppress chipping and peeling, has a valid configuration in order to suppress the deterioration of the semiconductor device 1 and the manufacturing yield. Therefore, by using the semiconductor device 1 and the manufacturing method of the semiconductor device 1 of the present embodiment, the productivity of the semiconductor memory device is improved.

<Method of Filling First Fill Material 41 in Gap 15>

Figure 5A:
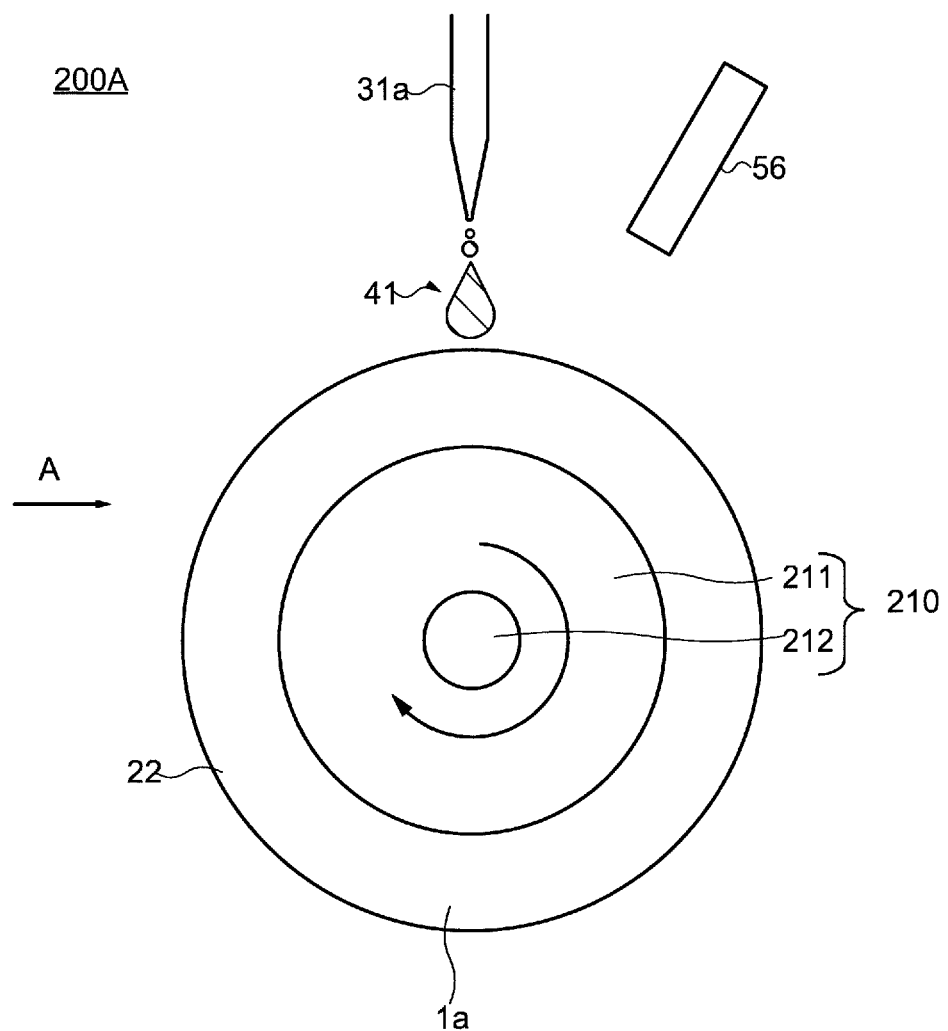
FIG. 5A is a diagram showing a semiconductor manufacturing device for manufacturing a semiconductor device according to an embodiment.
Figure 5B:
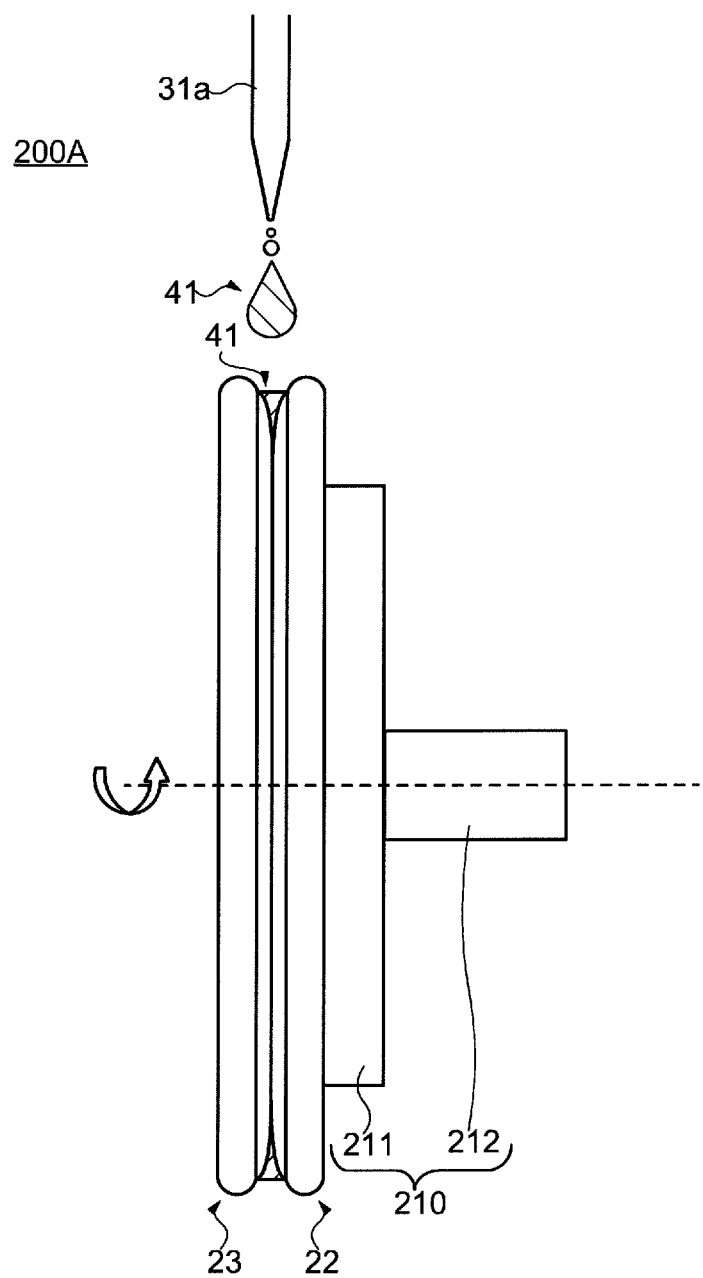
FIG. 5B is a diagram showing a semiconductor manufacturing device for manufacturing a semiconductor device according to an embodiment.
Figure 6:
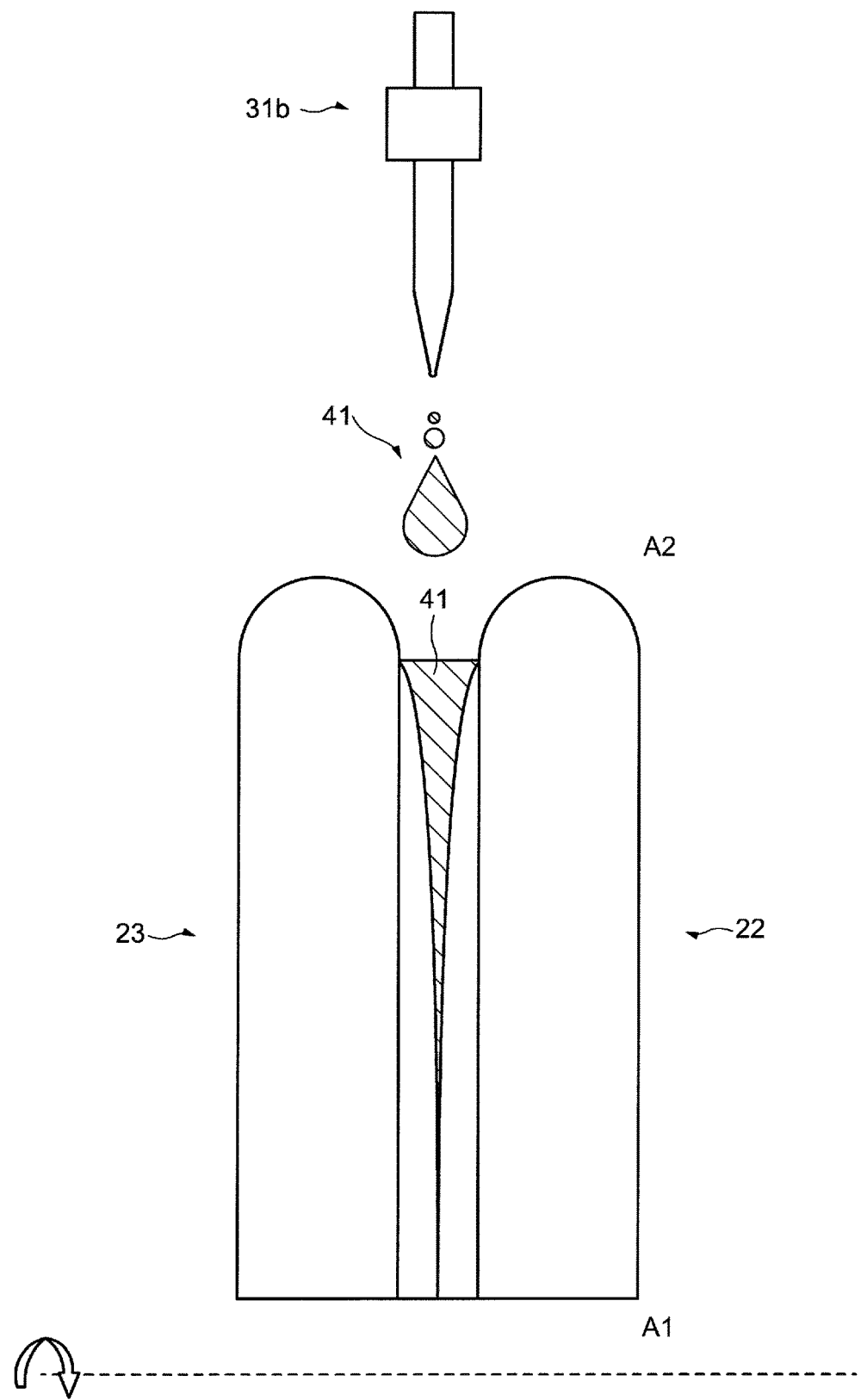
FIG. 6 is a diagram for explaining a manufacturing method of a semiconductor device according to an embodiment.
Figure 7:
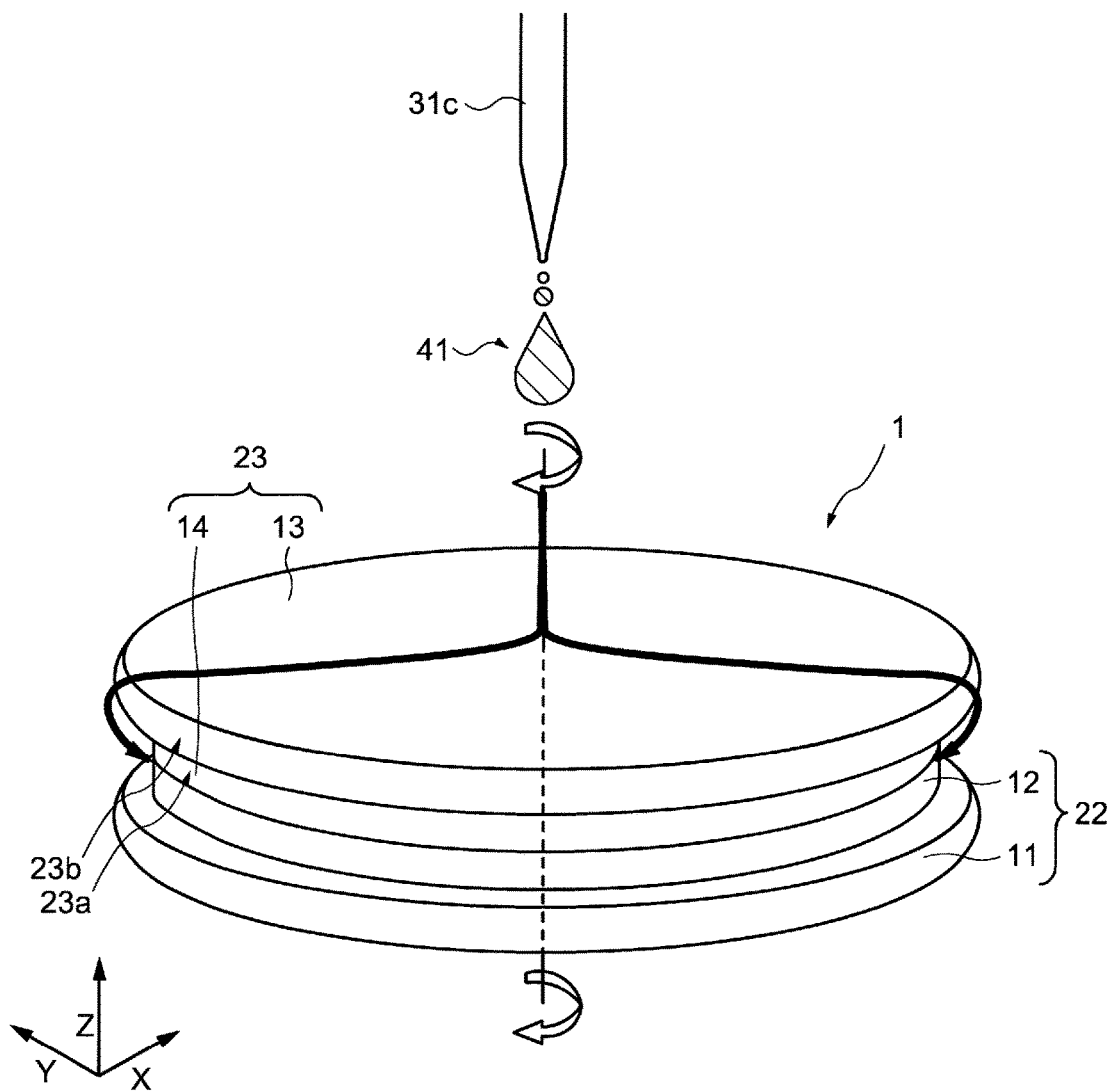
FIG. 7 is a diagram for explaining a manufacturing method of a semiconductor device according to an embodiment.

FIG. 5A is a view of a semiconductor manufacturing device 200A for manufacturing the semiconductor device 1 according to the present embodiment as viewed from a surface 1a (back surface, the surface opposite to the surface on which the first metallic pads 5 (FIG. 3) are formed) opposite to the surface 22a of the first semiconductor substrate 22. FIG. 5B is a side view of the semiconductor manufacturing device 200A as viewed from A in FIG. 5A. FIGS. 6 and 7 are diagrams for explaining examples of the manufacturing methods of the semiconductor device 1 according to the present embodiment. The manufacturing methods of the semiconductor manufacturing device for manufacturing the semiconductor device according to the present embodiment and the semiconductor device are not limited to the configurations shown in FIGS. 5A to 7. Descriptions of the same or similar components as those in FIGS. 1 to 4D may be omitted.

As shown in FIGS. 5A and 5B, the stack in which the first semiconductor substrate 22 and the second semiconductor substrate 23 are bonded together is attached to the semiconductor manufacturing device 200A. The semiconductor manufacturing device 200 A includes a holding unit 210, a dispense nozzle 31a, and a light irradiation device 56. The holding unit 210 includes a holding table 211, a support shaft 212, and a motor (not shown). The holding table 211 holds the stack by vacuum-adsorbing the surface 1a of the stack in which the first semiconductor substrate 22 and the second semiconductor substrate 23 are bonded together. The support shaft 212 supports the holding table 211. The motor rotates the support shaft 212. At this time, the center 101 (FIG. 1) of the stack overlaps the center or substantially the center of the support shaft 212, and the stack is held on the holding table 211 so as to be substantially perpendicular to the ground. For example, while maintaining a state such that the surface of the holding table 211 is substantially perpendicular to the ground, the holding table 211 rotates about the support shaft 212. The dispense nozzle 31a transfers or drops the first fill material 41 directly to the first gap portion 15a. The first filler material 41 penetrates the first gap portion 15a in the depth direction by capillary phenomenon. The light irradiation device 56 irradiates light to the first fill material 41 transferred or dropped into the first gap portion 15a, to cure the first fill material 41.

In the semiconductor manufacturing device 200A of the present embodiment, light is irradiated from the light irradiation device 56 to the first fill material 41 immediately after being directly transferred or dropped to the first gap portion 15a. As a result, before the first fill material 41 falls from the first gap portion 15a, filling the first fill material 41 in the first gap portion 15a, it is possible to cure the first fill material 41.

As shown in FIG. 6, a semiconductor manufacturing device 200B has a configuration in which the dispense nozzle 31a of the semiconductor manufacturing device 200A is replaced with a dropper 31b. Configurations of the semiconductor manufacturing device 200B other than the dropper 31b are the same as those of the semiconductor manufacturing device 200A, and descriptions thereof are omitted here. The dropper may be a syringe.

As shown in FIG. 7, a semiconductor manufacturing device 200C is a spin coater. Since the spin coater is a device known in the art, a detailed description thereof is omitted here. For example, the stack in which the first semiconductor substrate 22 and the second semiconductor substrate 23 are bonded is placed on a stage (not shown) rotatable about a central axis. The laminate rotates in the direction of the white arrow shown in FIG. 7 (clockwise) with respect to the central axis. In the laminated body, the first fill material 41 is dropped from the dispense nozzle 31c. The stack rotates around the central axis in the direction of a white arrow (clockwise) shown in FIG. 7 and the dispense nozzle 31c drops the first fill member 41 onto the stack. The dropped first fill material 41 flows from the end 23b of the second semiconductor substrate 23 to the surface 23a along a black arrow by centrifugal force. Further, the first fill material 41 is filled in the first gap portion 15a (FIG. 3) in the depth direction by the capillary event. After the first fill material 41 is filled in the first gap portion 15a (FIG. 3) in the depth direction, the stack is baked and annealed. Therefore, the first fill material 41 is filled in the first gap portion 15a (FIG. 3) in the depth direction and then cured.

As described above, according to the manufacturing method of the semiconductor device 1 of the present embodiment, the first fill material 41 can be filled in the depth direction of the first gap portion 15a and cured without dripping from the first gap portion 15a.

<Method of Filling Second Fill Material 42 in Gap 15>

Figure 8A:
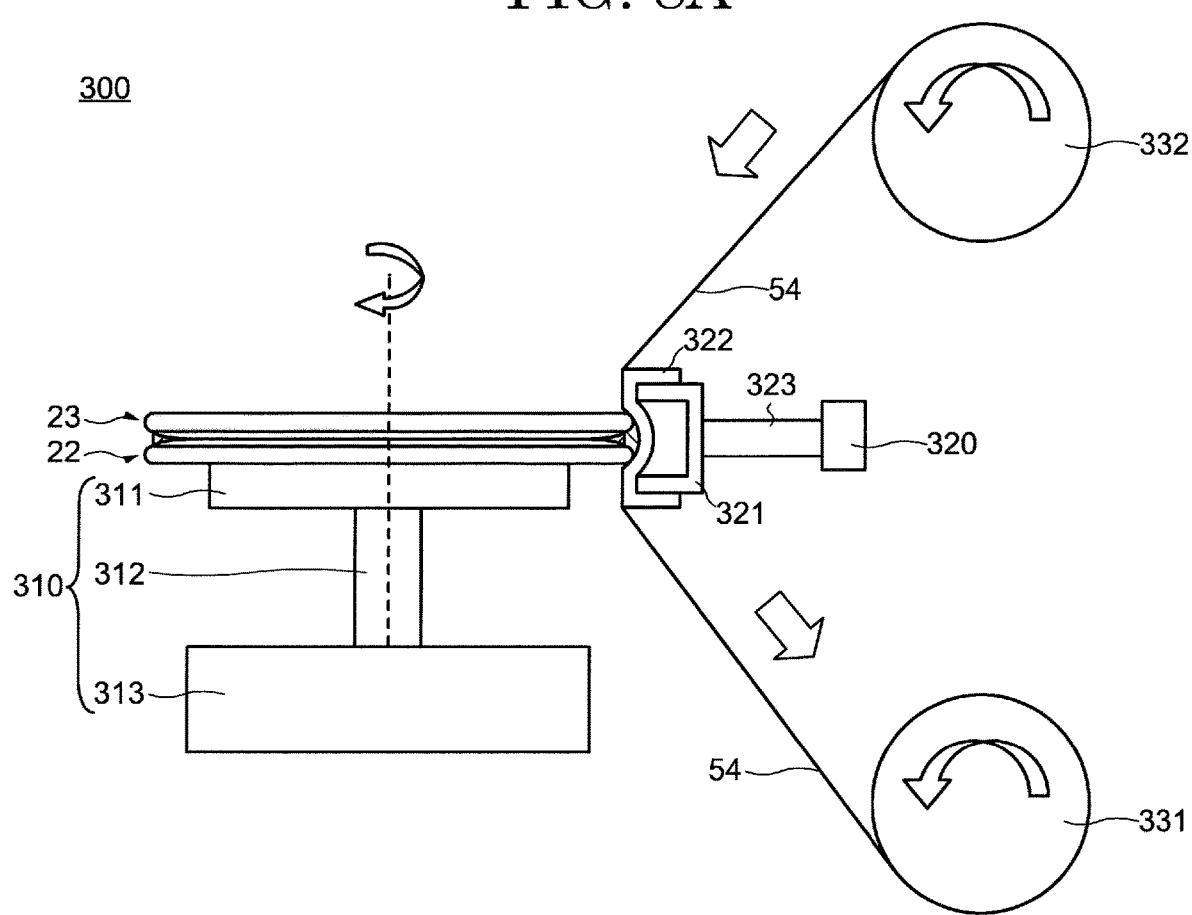
FIG. 8A is a diagram showing a semiconductor manufacturing device for manufacturing a semiconductor device according to an embodiment.
Figure 8B:
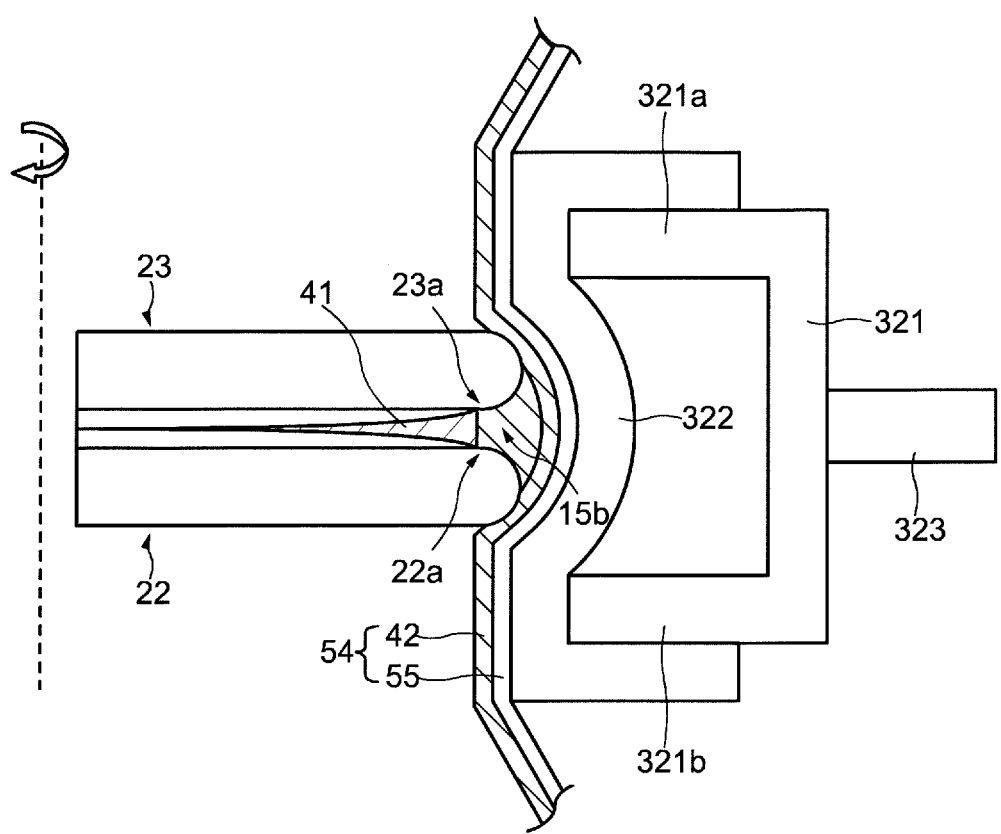
FIG. 8B is a diagram showing a semiconductor manufacturing device for manufacturing a semiconductor device according to an embodiment.

FIG. 8A is a view of a semiconductor manufacturing device 300 for manufacturing the semiconductor device 1 according to the present embodiment from the side. FIG. 8B is an enlarged view of ends of the first semiconductor substrate 22 and the second semiconductor substrate 23 of FIG. 8A. The manufacturing methods of the semiconductor manufacturing device for manufacturing the semiconductor device according to the present embodiment and the semiconductor device are not limited to the configurations shown in FIGS. 8A and 8B. Descriptions of the same or similar components as those of FIGS. 1 to 7 may be omitted.

As shown in FIG. 8A, the semiconductor manufacturing device 300 has a holding unit (rotation device) 310, a rubbing head 320, and a winding reel 331 and a delivering reel 332. The holding unit (rotation device) 310 holds the stack of the first semiconductor substrate 22 and the second semiconductor substrate 23. The rubbing head 320 rubs a second fill material adhering tape 54 to the second gap portion 15b. The winding reel 331 and the delivering reel 332, while applying a predetermined tension to the second fill material adhering tape 54, delivers the second fill material adhering tape 54, and winding the second fill material adhering tape 54.

The holding unit 310 includes a holding table 311, a support shaft 312, and a motor 313. The holding table 311 vacuum-adsorbs the stack and holds the stack. The support shaft 312 supports the holding table 311. The motor 313 rotates the support shaft 312. A lower end of the support shaft 312 is coupled to the motor 313. The support shaft 312 and the holding table 311 integrally rotate by the motor 313. For example, while maintaining a state such that the surface of the holding table 311 where the stack is held is substantially horizontal to the ground, the holding table 311 rotates with the support shaft 312 as a rotation axis.

As shown in FIG. 8B, the rubbing head 320 has a support unit 321, an elastic member 322, and an air cylinder 323. The support unit 321 has two protrusion parts 321a and 321b. The elastic member 322 is made of elastic rubber or the like stretched between the protrusion part 321a and the protrusion part 321b. The air cylinder 323 is connected to the support unit 321. The air cylinder 323 is used to move the rubbing head 320 to the optimum position.

In the mechanism of a polishing device used when polishing the end of the semiconductor substrate in the manufacturing process of the semiconductor device, by replacing a polishing tape to the second fill material adhering tape 54, the polishing device can be used as the semiconductor manufacturing device 300 according to the present embodiment.

As shown in FIG. 8A, the semiconductor manufacturing device 300 holds the stack on the holding table 311. At this time, so that the center of the semiconductor substrate 22 and the center of the semiconductor substrate 23 overlap the center of the support shaft 312, the stack is arranged on the holding table 311. The second fill material adhering tape 54 is attached so that a surface of a film 55 (FIG. 8B) side is in contact with the elastic member 322. When the air cylinder 323 is driven, the stack of the first semiconductor substrate 22 and the second semiconductor substrate 23 (FIG. 8B) is sandwiched between the two protrusion parts 321a (FIG. 8B) and 321b (FIG. 8B). As the outer peripheral portions of the first semiconductor substrate 22 and the second semiconductor substrate 23 are in contact with the elastic member 322 via the second fill material adhering tape 54, the rubbing head 320 is moved. Next, using the holding unit 310, the stack rotates at a constant rate. Further, the winding reel 331 and the delivering reel 332 rotate at a constant rate to deliver and wind the second fill material adhering tape 54 while applying a constant tension to the second fill material adhering tape 54.

More specifically, as shown in FIG. 8B, the second fill material adhering tape 54 is pressed to the outer peripheral portion of the stack of the first semiconductor substrate 22 and the second semiconductor substrate 23 by the elastic member 322 stretched between the protrusion parts 321a and 321b. At this time, the elastic member 322 pressed to the outer peripheral portion of the stack between the first semiconductor substrate 22 and the second semiconductor substrate 23 via the second fill material adhering tape 54 is stretched. As a result, tension is generated in the elastic member 322. By the tension of the elastic member 322, a constant force is applied to the outer peripheral portion of the stack of the first semiconductor substrate 22 and the second semiconductor substrate 23 via the second fill material adhering tape 54, and the second fill material 42 of the second fill material adhering tape 54 is rubbed to the second gap portion 15b. Further, since the winding reel 331 and the delivering reel 332 rotate at a constant rate, the new surface of the second fill material adhering tape 54 is always pressed to the gap. In addition, since the stack is rotating at a constant rate, it is possible to rub the second fill material 42 along the outer peripheral portion of the stack of the first semiconductor substrate 22 and the second semiconductor substrate 23.

After filling the second fill material 42 in the second gap portion 15b, if necessary, drying treatment, heat treatment, or light irradiation treatment is performed, to cure the second fill material 42. A method of curing the second fill material 42 is appropriately selected according to the material of the second fill material 42.

After the second fill material 42 is cured, the excess second fill material 42 protruding from the second gap portion 15b may be polished and removed by a polishing film. As a result, forming the second fill material 42, it is possible to suppress the stack from being contaminated by the extra second fill material 42.

<Configuration Example of Semiconductor Device 1>

Figure 9:
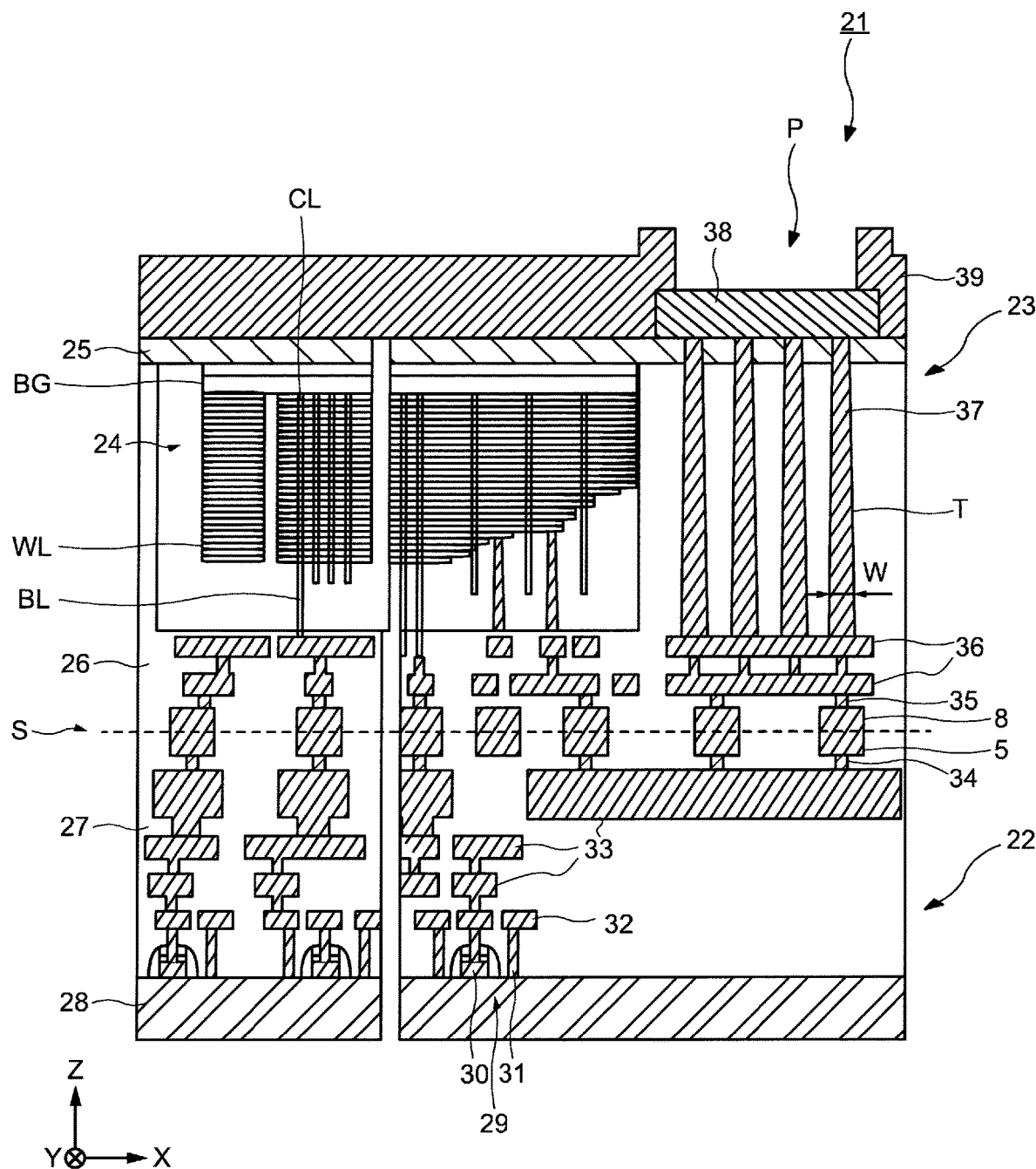
FIG. 9 is a cross-sectional view showing an exemplary configuration of a semiconductor device according to an embodiment.

FIG. 9 is a cross-sectional view showing an exemplary configuration of the semiconductor device 1 according to the present embodiment. The configuration of the semiconductor device 1 according to the present embodiment is not limited to the configuration shown in FIG. 9. Descriptions of the same or similar components as those in FIGS. 1 to 8B may be omitted.

As shown in FIG. 9, the X and Y directions are parallel and perpendicular to each other to the surface of a substrate 28, and the Z direction is perpendicular to the surface of the substrate 28. Here, the +Z direction is handled as the upward direction, and the −Z direction is handled as the downward direction. For example, a memory cell array 24 functioning as the second circuit unit 14 (FIG. 3) in the second semiconductor substrate 23 is positioned above the substrate 28, and the substrate 28 is positioned below the memory cell array 24. The −Z direction may or may not coincide with the direction of gravity. The substrate 28 is, for example, a silicon substrate (silicon wafer).

The second semiconductor substrate 23 includes a plurality of word lines WL, source lines BG, bit lines BL, and select gates (not shown). The plurality of word lines WL, the source lines BG, the bit lines BL, and the select gates (not shown) are electrode layers in the memory cell array 24. FIG. 9 shows a staircase structure of the memory cell array 24. One end (a first terminal) of a columnar portion CL penetrating the word line WL is electrically connected to the source line BG, the other end (a second terminal) is electrically connected to the bit line BL. The memory cell is formed at an intersection of the columnar portion CL and the word line WL.

The first semiconductor substrate 22 includes a plurality of transistors 29. Each of the plurality of transistors 29 has a gate electrode 30 provided on the substrate 28 via a gate insulating film, and a source diffusion layer (not shown) and a drain diffusion layer (not shown) provided in the substrate 28. The first semiconductor substrate 22 includes a plurality of plugs 31, a wiring layer 32 including a plurality of wirings, and a wiring layer 33 including a plurality of wirings. The plurality of plugs 31 are provided on the source diffusion layer or the drain diffusion layer of the plurality of transistors 29, the wiring layer 32 is provided on the plurality of plugs 31, and the wiring layer 33 is provided on the wiring layer 32. Further, the first semiconductor substrate 22 includes the plurality of via plugs 34 and a plurality of first metal pads 5. The plurality of via plugs 34 are provided on the wiring layer 33 and the plurality of first metallic pads 5 are provided on the via plug 34 in an insulating film 27. The first semiconductor substrate 22 having the first circuit unit 12 as described above (FIG. 3) functions as a control circuit (logic circuit) for controlling the second semiconductor substrate 23. In the present embodiment and the like, the control circuit is also referred to as the peripheral circuit.

The second semiconductor substrate 23 includes the plurality of second metallic pads 8, the plurality of via plugs 35, and a wiring layer 36 including a plurality of wirings. The plurality of second metal pads 8 are provided on the first metal pad 5 in an insulating film 26, the plurality of via plugs 35 are provided on the second metal pad 8, and the wiring layer 36 is provided on the via plug 35. Each word line WL or each bitline BL is electrically connected to the corresponding wiring in the wiring layer 36. The second semiconductor substrate 23 has a via plug 37 provided on the wiring layer 36 and a metal pad 38. The via plug 37 is provided in the insulating film 26 and the insulating film 25 while provided on the wiring layer 36, and the metal pad 38 is provided on the insulating film 25 and the via plug 37.

The metal pad 38 functions as an external connection pad of a semiconductor chip 21 shown in FIG. 9 and can be connected to a mounting substrate and other devices via a bonding wire, a solder ball, and a metal bump or the like. The second semiconductor substrate 23 has a passivation film 39 formed on the insulating film 25 and the metallic pad 38. The passivating film 39 has an opening P exposing an upper surface of the metal pad 38, and an opening P is used, for example, to connect the bonding wire to the metal pad 38.

While the configurations, manufacturing methods, and the like of some embodiments of the present disclosure have been described above, these configurations, manufacturing methods, and the like have been presented by way of example and are not intended to limit the scope of the invention. These novel embodiments may be implemented in a variety of other embodiments and may be implemented in any combination with no deviations from the abstract of the invention, and various omissions, replacements, and modifications may be made. These embodiments, configurations of the embodiments, manufacturing methods, and the like, or variations thereof, are included in the scope and abstract of the invention, as well as the claimed invention and its equivalents.

What is claimed is:

1. A semiconductor device manufacturing method, comprising:
    forming a first circuit unit and a first metal pad electrically connected to the first circuit unit on a first substrate,
    forming a second circuit unit and a second metal pad electrically connected to the second circuit unit on a second substrate;
    forming a stack bonding the first substrate and the second substrate by connecting the first metal pad and the second metal pad;
    filling a first fill material having a first viscosity in a gap located between an outer peripheral portion of the first substrate and an outer peripheral portion of the second substrate;
    filling a second fill material having a second viscosity higher than the first viscosity in the gap so as to be adjacent to the first fill material after filling the first fill material in the gap; and
    thinning the second substrate.

2. The semiconductor device manufacturing method according to claim 1, wherein the first fill material includes an organic compound, and the second fill material includes a glass material or an inorganic polymer.

3. The semiconductor device manufacturing method according to claim 2, wherein,
    in a cross-sectional view of the stack,
    the gap is provided along a surface of the first substrate and a surface of the second substrate, and includes a first gap portion and a second gap portion,
    the first gap portion is located closer to a center of the first substrate and a center of the second substrate than an end of the first substrate and an end of the second substrate, and
    the second gap portion is provided adjacent to the first gap portion between the end of the first substrate and the end of the second substrate, and is located closer to a center of the first substrate and a center of the second substrate than an end of the first substrate and an end of the second substrate, and farther from the center of the first substrate and the center of the second substrate than the first gap portion.

4. The semiconductor device manufacturing method, according to claim 3, wherein, the first fill material is filled in the first gap portion, and the second fill material is filled in the second gap portion.

5. The semiconductor device manufacturing method according to claim 4, wherein, in a cross-sectional view of the stack, the thickness of the second gap portion is thicker than the thickness of the first gap portion.

6. The semiconductor device manufacturing method according to claim 4, wherein, the first fill material is filled in the first gap portion using a dropper, a dispenser, or a spin coat.

7. The semiconductor device manufacturing method according to claim 6, wherein, the second fill material is filled in the second gap portion by rubbing a film attached with the second fill material in a thin-film shape into the second gap portion along the outer circumference of the stack.

8. The semiconductor device manufacturing method according to claim 6, further comprising, removing the second fill material protruding from the second gap using a polishing film after filling the second fill material in the second gap portion.

9. The semiconductor device manufacturing method according to claim 6, further comprising, forming a through electrode on at least one of the first substrate and the second substrate before forming the stack.

10. The semiconductor device manufacturing method according to claim 1, wherein
    the first substrate and the second substrate are semiconductor substrates.

11. The semiconductor device manufacturing method according to claim 1, wherein the first substrate and the second substrate are wafers.

12. A semiconductor device, comprising:
a first substrate including a first circuit unit and a first metal pad electrically connected to the first circuit unit;
a second substrate including a second circuit unit and a second metal pad electrically connected to the second circuit unit, the second substrate being bonded with the first substrate to form a stack and being thinner than the first substrate and the second metal pad being electrically connected to the first metal pad;
a gap provided between an outer peripheral portion of the first substrate and an outer peripheral portion of the second substrate;
a first fill material provided in the gap and having a first viscosity, and
a second fill material provided in the gap adjacent to the first fill material and having a second viscosity higher than the first viscosity.

13. The semiconductor device according to claim 12, wherein the first fill material includes an organic compound, and the second fill material includes a glass material or an inorganic polymer.

14. The semiconductor device according to claim 13, wherein,
in a cross-sectional view of the stack,
the gap is provided along a surface of the first substrate and a surface of the second substrate, and includes a first gap portion and a second gap portion,
the first gap portion is located closer to a center of the first substrate and a center of the second substrate than an end of the first substrate and an end of the second substrate, and
the second gap portion is provided adjacent to the first gap portion between the end of the first substrate and the end of the second substrate, and is located closer to a center of the first substrate and a center of the second substrate than an end of the first substrate and an end of the second of substrate, and farther from the center of the first substrate and the center of the second substrate than the first gap portion.

15. The semiconductor device according to claim 14, wherein, the first fill material is provided in the first gap portion, and the second fill material is provided in the second gap portion.

16. The semiconductor device according to claim 15, wherein,
in a cross-sectional view of the stack, the thickness of the second gap portion is thicker than the thickness of the first gap portion.

17. The semiconductor device according to claim 15, wherein at least one of the first substrate and the second substrate has a through electrode.

18. The semiconductor device according to claim 12, wherein
the first substrate and the second substrate are semiconductor substrates.

19. The semiconductor device according to claim 12, wherein the first substrate and the second substrate are wafers.

20. A semiconductor device manufacturing method, comprising:
forming a first layer on a first substrate;
forming a second layer on a second substrate;
bonding the first layer and the second layer to form a stack;
after bonding the first layer and the second layer, filling a first fill material having a first viscosity in a gap located between an outer peripheral portion of the first substrate and an outer peripheral portion of the second substrate; and
filling a second fill material having a second viscosity higher than the first viscosity in the gap so as to be adjacent to the first fill material after filling the first fill material in the gap.

21. A semiconductor device, comprising:
a stack including;
a first substrate;
a second substrate provided above the first substrate;
a first layer provided between the first substrate and the second substrate;
a second layer provided between the first layer and the second substrate, the second layer being bonded with the first layer;
a first gap portion provided between an outer peripheral portion of the first substrate and an outer peripheral portion of the second substrate, the first gap portion being filled with a first fill material provided in the gap and having a first viscosity; and
a second gap portion provided between an outer peripheral portion of the first substrate and an outer peripheral portion of the second substrate, the second gap portion being filled with a second fill material provided in the gap adjacent to the first fill material and having a second viscosity higher than the first viscosity,
wherein the first gap portion is provided between the first layer and the second gap portion.

* * * * *